United States Patent [19]
Irie et al.

[11] Patent Number: 5,314,606
[45] Date of Patent: May 24, 1994

[54] LEADLESS CERAMIC PACKAGE WITH IMPROVED SOLDERABILTY

[75] Inventors: Taka Irie; Aki Nomura, both of San Diego, Calif.

[73] Assignee: Kyocera America, Inc., San Diego, Calif.

[21] Appl. No.: 18,012

[22] Filed: Feb. 16, 1993

[51] Int. Cl.$^5$ ............................................. C25D 5/02
[52] U.S. Cl. ................................. 205/128; 205/170; 205/181
[58] Field of Search ................. 205/128, 170, 181; 437/245

[56] References Cited

U.S. PATENT DOCUMENTS 3,926,746 12/1975 Hargis ................................. 205/162
4,681,656 7/1987 Byrum ................................ 205/126
4,768,077 8/1988 Scherer ................................ 357/70

Primary Examiner—John Niebling
Assistant Examiner—Kishor Mayekar
Attorney, Agent, or Firm—Spensley Horn Jubas & Lubitz

[57] ABSTRACT

A method of fabricating a leadless ceramic package having improved solderability characteristics. The ceramic packages are singulated from the package array before electroplating. This eliminates the damage which may occur to the plating layer during singulation, and permits plating of base metal exposed by singulation. Furthermore, the plating solution is not required to penetrate small-diameter castellation holes, which would often result in incomplete electroplating of the castellation surfaces.

11 Claims, 5 Drawing Sheets

LEADLESS CERAMIC PACKAGE WITH IMPROVED SOLDERABILTY

BACKGROUND OF THE INVENTION

1. Field of the Invention

This invention relates generally to integrated circuit packages, and more particularly to a method of making a leadless ceramic package having improved solderability characteristics.

2. Related Art

In the electronics industry, integrated circuits are commonly encased in packages made of plastic or ceramic. A ceramic integrated circuit package, sometimes referred to as a "chip carrier", comprises a ceramic substrate including electrical contacts to connect an integrated circuit enclosed within the package to external circuitry. The package is hermetically sealed with a lid, which may be, for example, metal or ceramic.

Prior-art methods of fabricating ceramic integrated circuit packages generally process the packages in array form. A package array may be defined as consisting of a plurality of attached individual ceramic package substrates. Conductive traces of a base metal (such as molybdenum-manganese or tungsten) are printed onto the array and into holes formed within the array, and the array is co-fired. At least one set of holes defines the perimeter of each device package. After firing, the array is immersed in an electrolytic bath and the conductive traces are plated with one or more plating metals. After the electroplating has been completed, singulation is performed to cut the array into a plurality of individual device packages.

It is important to note that presently-existing methods of fabricating ceramic packages generally electroplate the packages before singulation takes place. Singulation is generally performed as a final step in the production process. Since the carriers are processed as an array until the final production steps are completed, this method is relatively efficient. However, this production method has major problems related to the solderability of the final product. Solderability is an important parameter; the final product must possess at least a minimum degree of solderability in order to fulfill its intended purpose.

A frequently-cited solderability standard is specified in MIL Standard 883C, Method 2003.6. However, in many cases, this specification must be waived or relaxed, because meeting the specification would entail expensive, impractical rework of the device packages. Presently-existing methods of fabricating chip carriers are not able to consistently meet MIL-STD 883C specifications.

The poor solderability of prior-art packaging methods is attributable to two major causes. First of all, the singulation (snapping) process results in the exposure of base metallization at the perimeter of each package defined by a hole pattern in the pre-singulation array. After singulation, half-cylinders form along these holes, which are referred to as "castellation". The singulation process may also expose the ceramic substrate. Neither the base metal nor the ceramic substrate provides adequate solderability. The base metal is chosen for its adhesion properties to ceramic and not for its desirable solderability characteristics. Consequently, a widely-utilized base metal is either molybdenum-manganese (Mo-Mn) or tungsten (W), both of which have relatively poor solderability. Secondly, the electroplating is performed on the package array. The flow of the electroplating solution is often restricted at the package holes, due to the fact that the holes are of a relatively small diameter (typically 0.010 to 0.020 diameter). Therefore, the plating on the base metal castellations is often of uneven thickness, and some areas may remain unplated.

FIG. 1 is an enlarged perspective view of a typical castellation produced by prior-art package fabrication methods. The package consists of three ceramic layers 40, 42, and 44. The axis of the half-cylinder castellation is along the line 18—18'. Due to the fact that the package arrays are singulated (cut into individual device packages) after plating, the inner coating of base metal 20, 22 is necessarily exposed at the edges of the castellation, along the singulation line. Furthermore, the plating metal is frequently unable to completely penetrate the pre-singulation castellation hole 18, thus resulting in uneven or thin metal plating as shown at 24.

It is therefore desirable to provide a means for fabricating ceramic packages with improved solderability compared to the prior art. The present invention provides such a means.

SUMMARY OF THE INVENTION

The method of the present invention provides a leadless ceramic package having improved solderability characteristics. A novel feature of the present invention is that the ceramic packages are singulated from the package array before electroplating. This method differs from typical prior-art methods, which generally perform singulation after electroplating.

According to the method of the present invention, a ceramic package array consisting of a plurality of attached ceramic packages is formed. Each package comprises one or more ceramic substrate layers, each having electrically conductive traces formed on the substrate. These traces include a layer of base metal, such as molybdenum-manganese or tungsten, applied to a substrate. These metals are available in the form of an ink, and may be printed onto a ceramic substrate. The ceramic layers of the array are stacked and co-fired, in known fashion. The array is then singulated into individual packages, creating castellations along the sides of each package.

After singulation, one or more electrically conductive tie-bars are attached to one or more portions of the electrically conductive traces of each individual singulated package, for example, by means of a printing process. After attaching the tie-bars, the chip carrier is fired a second time at a relatively high temperature, such as about 1300° C., to fix the tie-bars.

After the tie-bar attachment step has been completed, the carrier is plated electrolytically, for example, by bringing the tie-bars into contact with a plating fixture. If such a fixture is employed, an electrical charge is applied to the fixture and the carrier is immersed in an electrolytic solution bath. The electrolytic plating process deposits an intermediate layer of metal, such as nickel, on top of each layer of exposed base metal. Next, a layer of solderable metal, such as gold, is applied over the intermediate metal layer. The tie-bars are then removed.

The invention provides ceramic packages having improved solderability characteristics due to the fact that singulation is performed before electroplating. Since the packages have already been singulated when electroplating is performed, the electroplating solution need not penetrate small-diameter pre-singulation castellation holes. Due to the geometry of the pre-singulation castellation holes, if singulation is performed after plating, the base metal layer is necessarily exposed at the edges of the castellation half-cylinder. However, when plating is performed after singulation, as in the present invention, the entire castellation surface receives a layer of plating.

Furthermore, the plated packages need not be subjected to the forces of a singulation, which could remove portions of the metal plating. In this manner, the invention provides metal plating layers which are smooth and uniform. These plated surface offer superior solderability characteristics relative to the prior art. The method of the present invention is capable of producing ceramic packages which consistently meet the previously-cited MIL-SPEC for solderability.

BRIEF DESCRIPTION OF THE DRAWINGS

Like reference numbers in the drawings refer to like elements.

DETAILED DESCRIPTION OF THE PREFERRED EMBODIMENTS

Figure 1:
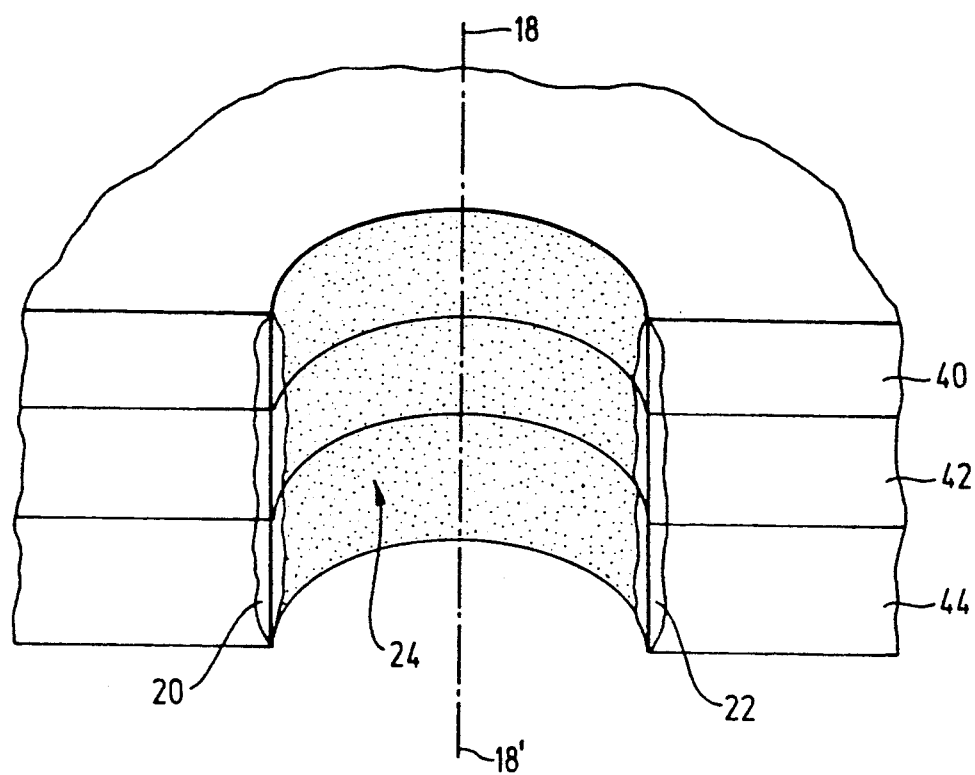
FIG. 1 is an enlarged perspective view of a typical castellation produced by prior-art package fabrication methods.
Figure 2:
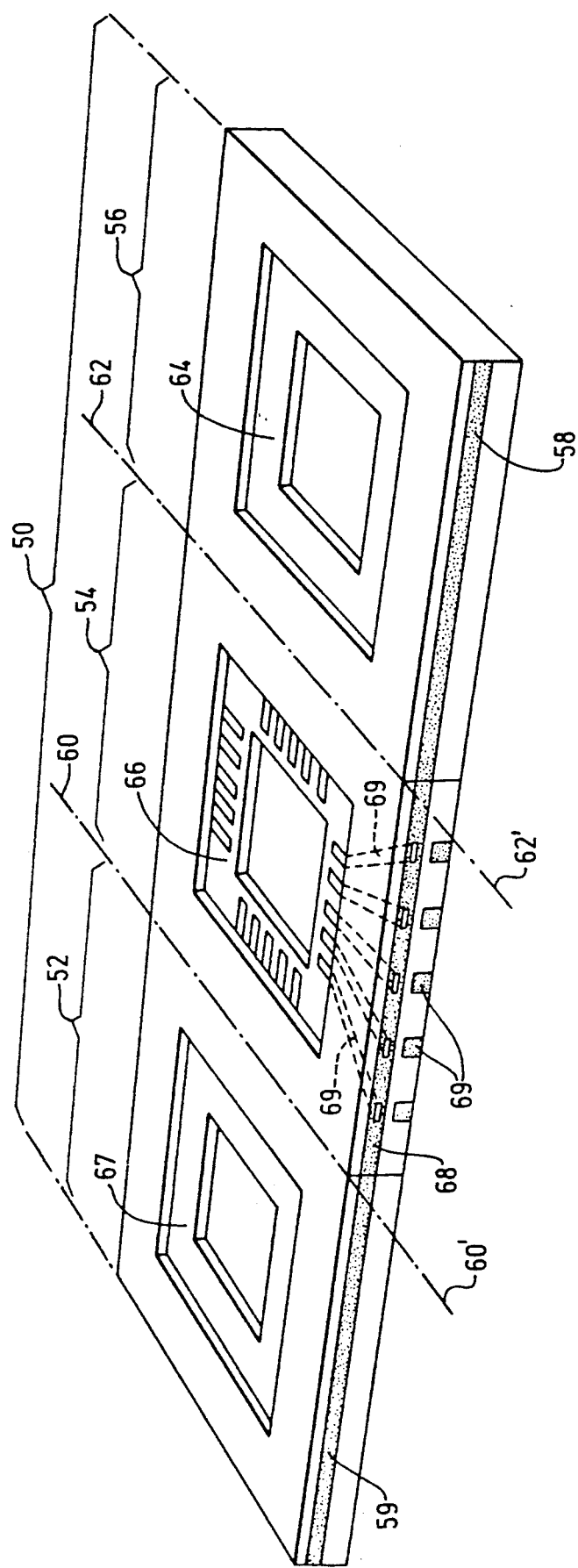
FIG. 2 is a perspective view of a ceramic package array constructed in accordance with the present invention.

The method of the present invention provides leadless ceramic packages having improved solderability characteristics. FIG. 2 shows a ceramic package array 50 consisting of a plurality of attached ceramic packages 52, 54, 56. As is known in the art, each package 52, 54, 56 comprises one or more ceramic substrate layers, each having electrically conductive traces formed on the substrate. The conductive traces comprise a base metal (such as molybdenum-manganese or tungsten) affixed onto the array substrates and into holes formed within the array substrates. At least one set of holes defines the perimeter of each device package. Conductive trace base metal is available in the form of an ink, and may be printed onto the ceramic substrates. The ceramic layers of the array are stacked and co-fired, in known fashion.

The ceramic packages 52, 54, 56 are then singulated from the array 50 along lines 60–60' and 62–62' before electroplating. One or more tie-bars 58, 59, 68 are attached to one or more portions of the electrically conductive traces of each individual singulated package. The tie-bars are used to provide an electrical connection to each of the traces within each package. According to one preferred embodiment of the invention, the tie-bars 58, 59, 68 consist of molybdenum-manganese or tungsten metal, or any electrically conductive equivalent. Such materials are available in ink form and may be affixed to the ceramic substrate by means of a printing process. The tie-bars 58, 59, 68 may be printed, for example, on one or more of the four sides of a square or rectangular ceramic package.

Regardless of the specific configuration of tie-bars which is adopted, an optional step may be performed to provide electrically conductive pathways from the tie-bars 58 and 59 to the package interiors 64, 66, 67. This step is accomplished by laying out conductive traces 69 consisting of a conductive ink or the equivalent. Furthermore, the tie-bars 58, 59, 68 may be connected to optional contact bonding fingers and footprints on or within each package 52, 54, 56.

After the tie-bars 58, 59, 68 are printed onto the packages 52, 54, 56, each of the packages is fired at a relatively high temperature, such as about 1300° C., to fix the tie-bars.

After the tie-bars 58, 59, 68 have been attached and the packages have been fired, the next step is electroplating the packages 52, 54, 56. The packages 52, 54, 56 are plated electrolytically by using the tie-bars as electrodes, and bringing the tie-bars 58, 59, 68 into contact with a plating fixture. The plating fixture may be fabricated of stainless steel. An electric charge is applied to the fixture and the package is immersed in an electrolytic solution bath. To plate most types of metals, a negative charge must be applied to the fixture. An intermediate layer of metal is applied over any exposed base metal of the electrically-conductive connections. The intermediate layer metal preferably consists of a metal that offers good adhesion to the base metal, such as nickel. To plate nickel onto the base metal of the package, an electrolytic solution of nickel sulfamate, or an equivalent nickel salt, may be used. If it is desired to plate metals other than nickel onto the base metal, it is possible to use other metal salts for the electrolytic solution.

For most ceramic package applications, a second layer of plating is applied over the first layer. The use of two layers of plating is generally required because solder does not often adhere well to metal suitable for plating a base metal. Consequently, a metal is selected for the final layer which offers the required solderability characteristics. Frequently, gold is used as the second plating metal. The corresponding plating solution is commonly a gold chloride compound or the equivalent.

After plating, the tie-bars 58, 59, 68 are removed, such as by laser cutting, diamond saw cutting, abrasive high-pressure liquid cutting, or mechanical grinding.

Figure 3A:
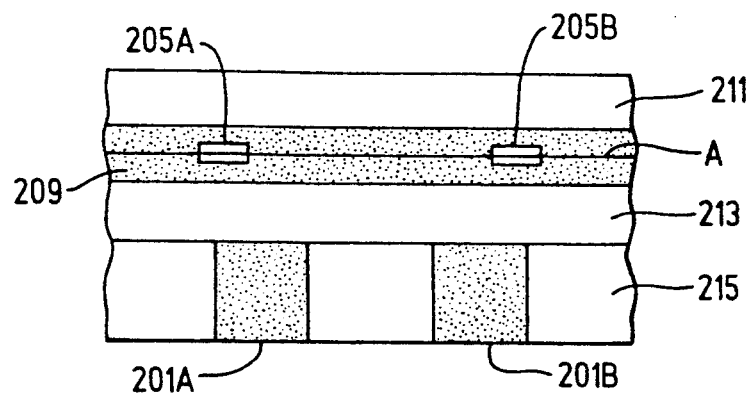
FIGS. 3A, 3B, and 3C illustrate two cross-sectional views and a close-up plan view of a ceramic package constructed in accordance with the present invention.
Figure 3B:
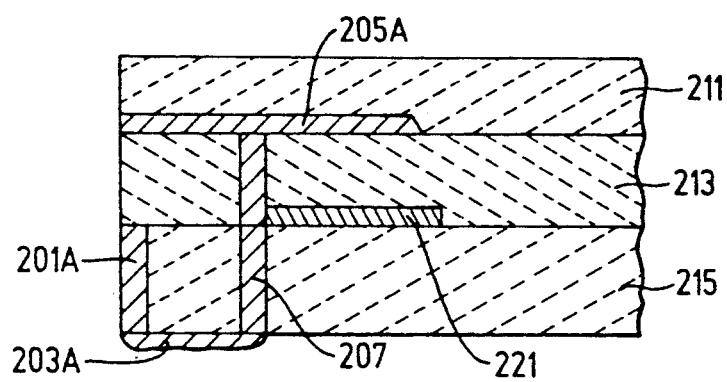
Figure 3C:
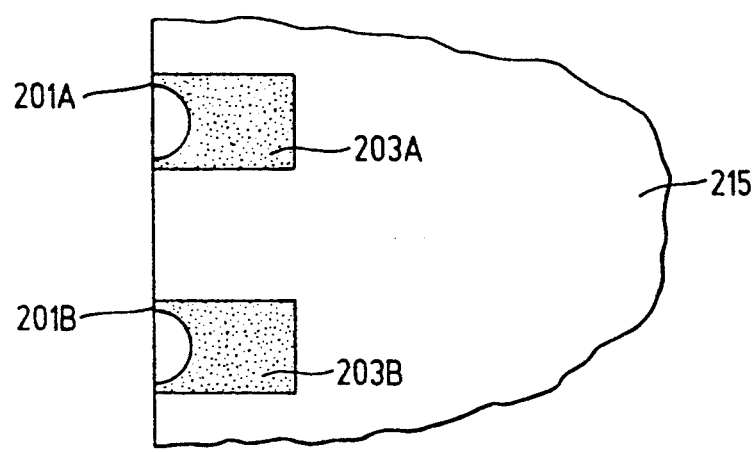

FIGS. 3A, 3B, and 3C respectively illustrate two cross-sectional views and one plan view of a ceramic package 200 constructed in accordance with the aforementioned process. The package 200 includes three ceramic layers 211, 213, 215. Plating tie-bar 209 is printed onto the sides of the ceramic package 200 at the intersection A of layer 211 and layer 213. Two castellations 201A and 201B are shown which, in this example, are configured to form bottom pads 203A and 203B. A wire bond post 205A may be employed to provide electrical connections along an interface between two ceramic layers 211 and 213. A via connection 207 is utilized to provide electrical connections through the various ceramic layers 211, 213, 215. An internal trace 221 may be used in lieu of, or in addition to, the wire bond post 205 to provide electrical connections along the interfaces of layers 211 and 213.

Figure 4C:
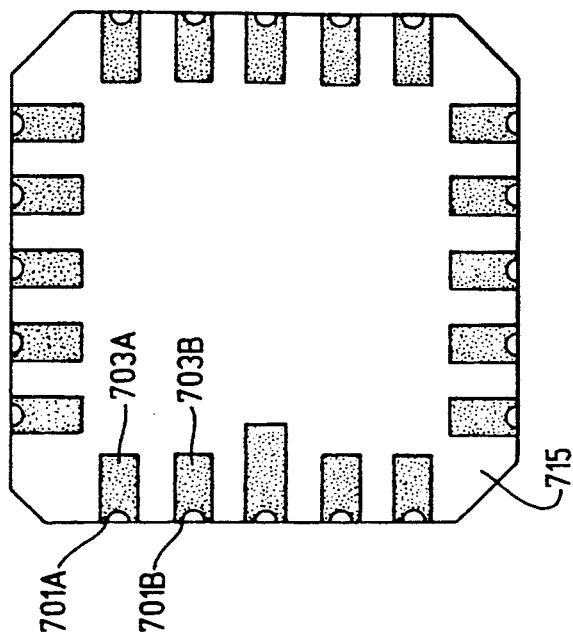
FIGS. 4A, 4B, and 4C illustrate a top view, a side view, and a bottom view of a ceramic package constructed in accordance with the present invention.
Figure 4B:
Figure 4A:
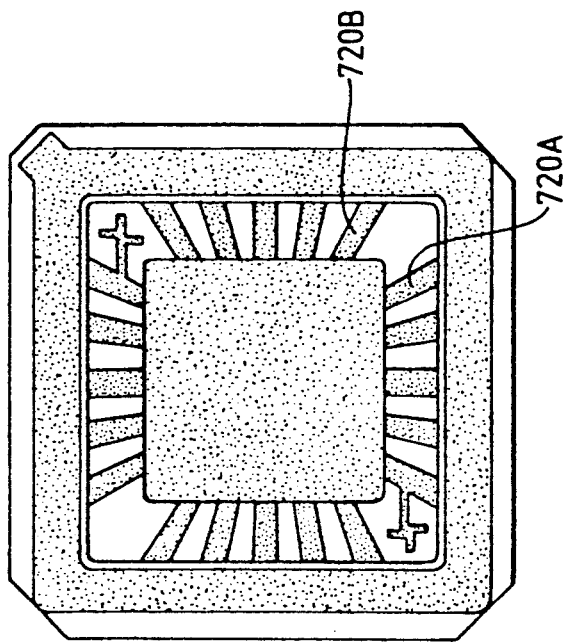

FIGS. 4A, 4B, and 4C respectively illustrate a top view, a side view, and a bottom view of a ceramic package constructed in accordance with the invention. The ceramic package of FIG. 4 is similar to the ceramic package 52 illustrated in FIG. 2. The package includes a plurality of castellations 701A and 701B which are configured to form bottom pads 703A and 703B. The bottom pads 703A and 703B are plated onto the ceramic substrate 715. The preferred embodiment illustrated in FIG. 4 employs a plurality of electrically conductive traces 720A and 720B. These traces 720A and 720B provide a plurality of independent conductive pathways between the bottom pads 703A and 703B and the interior of the ceramic package.

Figure 5:
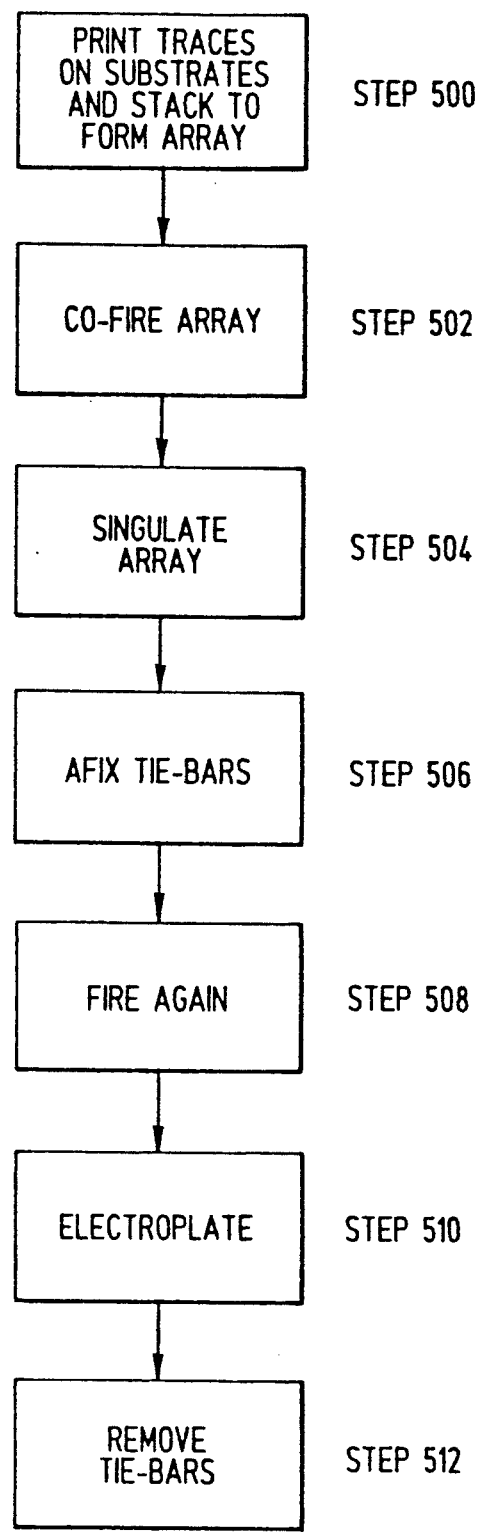
FIG. 5 is a flow chart of the process steps comprising the present invention.

FIG. 5 is a flow chart of the process steps comprising the present invention:

1. An array of ceramic packages is formed by printing multiple hole-bearing substrates with conductive traces and stacking the substrates (Step 500).
2. The array is then co-fired (Step 502).
3. After co-firing, the array of ceramic package is singulated into individual packages (Step 504).
4. Plating tie-bars are printed on each package, in electrical contact with the conductive traces of each package (Step 506).
5. The packages are again fired (Step 508).
6. Each package is electroplated, using the tie-bars as electrodes. Plating preferably includes applying a first layer of nickel and a second layer of gold (Step 510).
7. The plating tie-bars are then removed from the package, for example, by mechanical grinding (Step 512).

A novel feature of the invention is that the singulation step is performed before electroplating. The advantages of this fabrication method are significant. Since the packages have already been singulated when electroplating is performed, the electroplating solution need not penetrate small-diameter pre-singulation castellation holes. In the present invention, the entire castellation surface receives a layer of plating.

Furthermore, the plated packages need not be subjected to the forces of a singulation, which could remove portions of the metal plating. In this manner, the invention provides metal plating layers which are smooth and uniform. These plated surfaces offer superior solderability characteristics relative to the prior art. The method of the present invention is capable of producing ceramic packages which consistently meet the previously-cited MIL-SPEC for solderability.

A number of embodiments of the present invention have been described. Nevertheless, it will be understood that various modifications may be made without departing from the spirit and scope of the invention. For example, the ceramic packages need not be formed as part of an array. The invention can also be used for single large ceramic packages having castellations formed as described above. Accordingly, it is to be understood that the invention is not to be limited by the specific illustrated embodiments, but only by the scope of the appended claims.

We claim:

1. A method of fabricating at least one ceramic package, comprising the steps of:
   (1) forming from an array of packages at least one individual ceramic package having castellations including electrically conductive traces formed of base metal;
   (2) attaching at least one electrically-conductive tie-bar to each said individual ceramic package;
   (3) electroplating at least one metal layer on exposed base metal conductive traces of each said individual ceramic package; and
   (4) removing each said tie-bar from each said individual ceramic package.

2. A method of fabricating at least one ceramic package, comprising the steps of:
   (1) forming an array comprising a plurality of attached individual ceramic packages, each including electrically conductive traces formed of base metal;
   (2) co-firing the ceramic packages;
   (3) singulating individual ceramic packages from the array;
   (4) attaching at least one electrically-conductive tie-bar to at least one singulated package;
   (5) electroplating at least one metal layer on exposed base metal conductive traces of the at least one singulated ceramic package; and
   (6) removing each said tie-bar from the at least one individual ceramic package.

3. The method of fabricating at least one ceramic package of claims 1 or 2, wherein the step of attaching at least one tie-bar includes the step of printing each said tie-bar onto each said individual ceramic package.

4. The method of fabricating at least one ceramic package of claim 3, wherein the step of attaching at least one said tie-bar includes printing each tie-bar onto each said individual ceramic package using an ink selected from the group consisting of molybdenum-manganese and tungsten.

5. The method of fabricating at least one ceramic package of claim 4, wherein the step of attaching at least one tie-bar includes firing each said individual ceramic package after printing of all said tie-bars.

6. The method of fabricating at least one ceramic package of claims 1 or 2, wherein the step of removing each said tie-bar includes using one of laser cutting, diamond saw cutting, abrasive high-pressure liquid cutting, and mechanical grinding.

7. The method of fabricating at least one ceramic package of claims 1 or 2, wherein the step of electroplating includes the step of plating an intermediate layer of metal onto the exposed base metal conductive traces.

8. The method of fabricating at least one ceramic package of claim 7, wherein the intermediate layer of metal is nickel.

9. The method of fabricating at least one ceramic package of claim 7, wherein the step of electroplating further includes the step of plating a layer of solderable metal onto the intermediate layer of metal.

10. The method of fabricating at least one ceramic package of claim 9, wherein the solderable metal is gold.

11. The method of fabricating at least one ceramic package of claims 1 or 2, wherein the step of attaching at least one tie-bar further includes the step of providing at least one electrically conductive pathway from at least one of the tie-bars to the at least one electrically conductive trace in an interior of each said individual ceramic package.

* * * * *